United States Patent
Kang et al.

(10) Patent No.: US 12,406,921 B2
(45) Date of Patent: Sep. 2, 2025

(54) ELECTRONIC DEVICE

(71) Applicant: Advanced Semiconductor Engineering, Inc., Kaohsiung (TW)

(72) Inventors: Jung Jui Kang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 412 days.

(21) Appl. No.: 17/870,676

(22) Filed: Jul. 21, 2022

(65) Prior Publication Data

US 2024/0030125 A1 Jan. 25, 2024

(51) Int. Cl.
| | |
|---|---|
| H01L 23/522 | (2006.01) |
| H01L 23/00 | (2006.01) |
| H01L 23/31 | (2006.01) |
| H01L 23/498 | (2006.01) |
| H01L 23/50 | (2006.01) |
| H01L 23/528 | (2006.01) |

(52) U.S. Cl.
CPC ...... *H01L 23/5226* (2013.01); *H01L 23/3128* (2013.01); *H01L 23/49816* (2013.01); *H01L 23/50* (2013.01); *H01L 23/5286* (2013.01); *H01L 24/13* (2013.01); *H01L 24/19* (2013.01); *H01L 2224/12105* (2013.01); *H01L 2224/18* (2013.01)

(58) Field of Classification Search
CPC ............ H01L 23/5226; H01L 23/3128; H01L 23/49816; H01L 23/50; H01L 23/5286; H01L 23/5389; H01L 24/13; H01L 24/19; H01L 2224/12105; H01L 2224/18
See application file for complete search history.

(56) References Cited

U.S. PATENT DOCUMENTS

| | | | | |
|---|---|---|---|---|
| 11,469,206 | B2* | 10/2022 | Elsherbini | H01L 24/83 |
| 2017/0207197 | A1* | 7/2017 | Yu | H01L 24/92 |
| 2017/0365580 | A1 | 12/2017 | Shih et al. | |
| 2020/0035604 | A1* | 1/2020 | Rubin | H01L 25/0652 |
| 2020/0411443 | A1* | 12/2020 | Guo | H01L 24/09 |
| 2021/0043571 | A1* | 2/2021 | Hou | H01L 25/50 |
| 2021/0118758 | A1* | 4/2021 | Cheng | H01L 24/32 |

* cited by examiner

*Primary Examiner* — Dao H Nguyen

(74) *Attorney, Agent, or Firm* — FOLEY & LARDNER LLP

(57) ABSTRACT

An electronic device is disclosed. The electronic device includes a first circuit structure, a first die, a second die, and a third die. The first die is disposed below the first circuit structure. The second die is disposed below the first circuit structure. The third die is disposed above the first circuit structure and electrically connects the first die to the second die. The first die communicates with the second die through the third die.

19 Claims, 6 Drawing Sheets

ELECTRONIC DEVICE

BACKGROUND

1. Field of the Disclosure

The present disclosure relates to an electronic device, and in particular to an electronic package having a plurality of dies.

2. Description of the Related Art

As electronic packages are miniaturized, the number of transistors in a single chip (or processor) increases significantly, and thus the manufacturing yield may decrease due with increased complexity of process. Accordingly, a full-function chip (or processor) may be manufactured by breaking down one processor into multiple partitions (or cores) which are manufactured separately followed by integration and interconnection thereof.

SUMMARY

In some embodiments, an electronic device includes a first circuit structure, a first die, a second die, and a third die. The first die is disposed below the first circuit structure. The second die is disposed below the first circuit structure. The third die is disposed above the first circuit structure and electrically connects the first die to the second die. The first die communicates with the second die through the third die.

In some embodiments, an electronic device includes a computing unit, input/output (I/O) unit, and a bridge unit. The I/O unit is disposed adjacent to the computing unit. The bridge unit is configured to transmit a non-power signal from the computing unit to the I/O unit. The computing unit is configured to receive a power through a backside surface thereof.

In some embodiments, an electronic device includes a memory unit, an input/output (I/O) unit, and a carrier. The computing unit has an active surface facing the memory unit. The I/O unit has an active surface facing the memory unit. The I/O unit communicates with the computing unit through the memory unit. The carrier is configured to provide a power to the computing unit and dissipate heat from the I/O unit.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
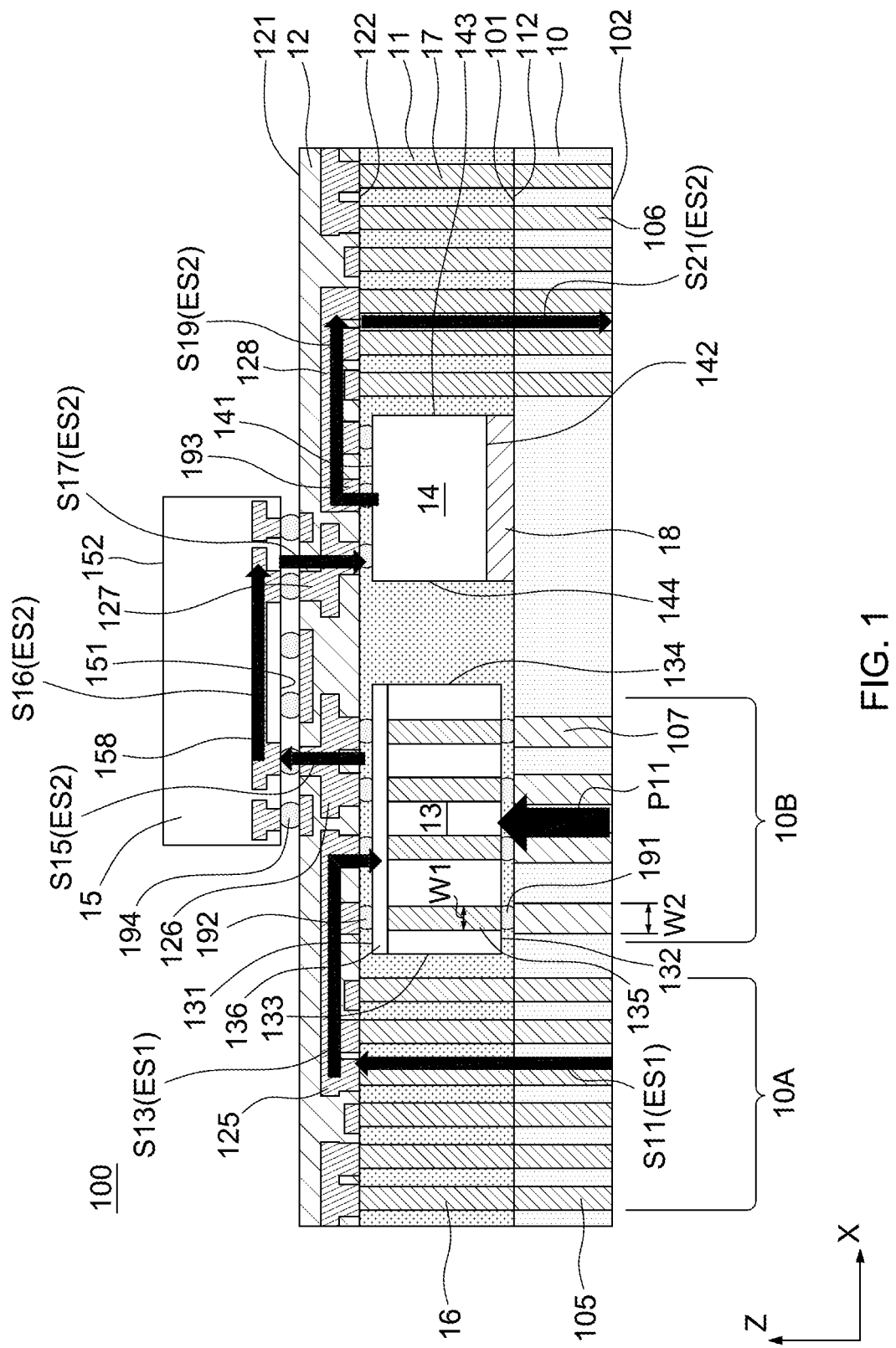
FIG. 1 is a cross-sectional view of an electronic device in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of an electronic device 100 in accordance with some embodiments of the present disclosure. The electronic device 100 may include a circuit structure 10, an encapsulating layer 11, a circuit structure 12, dies 13, 14, and 15, and connection elements 16 and 17.

The circuit structure (or a carrier, a substrate) 10 is disposed below the die 13 and the die 14. The circuit structure 10 is disposed below the circuit structure 12. The circuit structure 10 has a first surface 101 and a second surface 102 opposite thereto. In some embodiments, the circuit structure 10 may include an interposer. In some embodiments, the circuit structure 10 may include, for example, a printed circuit board (PCB), such as a paper-based copper foil laminate, a composite copper foil laminate, or a polymer-impregnated glass-fiber-based copper foil laminate. In some embodiments, the circuit structure 10 may include a semiconductor substrate including silicon, germanium, or other suitable materials. The circuit structure 10 may be referred as a carrier, or substrate.

The encapsulating layer 11 is disposed on the first surface 101 of the circuit layer 10. The encapsulating layer 11 is disposed between the circuit layer 10 and the circuit layer 12. The encapsulating layer 11 has a first surface 111 and a second surface 112 opposite thereto. The first surface 111 faces away from the first surface 101 of the circuit layer 10 and the second surface 112 faces the first surface 101 of the circuit layer 10. The second surface 112 of the encapsulating layer 11 may be in contact with the first surface 101 of the circuit layer 10.

In some embodiments, the encapsulating layer 11 may include an epoxy resin including fillers, a molding compound (e.g., an epoxy molding compound or other molding compound), polyimide, a phenolic compound or material, a material including silicone dispersed therein, or a combination thereof.

The circuit structure 12 is disposed over the first surface 111 of the encapsulating layer 11. The circuit structure 12 is disposed above the circuit structure 10. The circuit structure 12 is disposed between the dies 13 and 14 and the die 15. The circuit structure 12 has a first surface 121 and a second surface 122 opposite thereto The first surface 121 of the circuit structure 12 may face away from the circuit structure 10 and the second surface 122 of the circuit structure 12 may face the circuit structure 10. In some embodiments, the circuit structure 12 may include, for example, a printed circuit board (PCB), such as a paper-based copper foil laminate, a composite copper foil laminate, or a polymer-impregnated glass-fiber-based copper foil laminate. In some embodiments, the circuit structure 12 may include a semiconductor substrate including silicon, germanium, or other suitable materials.

The die (or a computing unit) 13 may be disposed below the circuit structure 12. The die 13 may be disposed over the second surface 122 of the circuit structure 12. The die 13 may be disposed above the circuit structure 10. The die 13 may be disposed between the circuit structures 10 and 12. The die 13 may be surrounded by the encapsulating layer 11. In some embodiments, the die 13 may be encapsulated by the encapsulating layer 11. The die 13 has a first surface 131 facing the circuit structure 12 and a second surface 132 opposite to the first surface 131 of the die 13. The first surface 131 may be an active surface, through which the die 13 receives data signals from other components of the electronic device 100 or an external component. The active surface 131 of the die 13 may face the die 15. The die 13 may include an active region 136. The active region 136 may include one or more active circuits adjacent to the first surface 131. The second surface 132 may be a backside surface, through which the die 13 may receive power from other components of the electronic device 100 or an external power source. The die 13 may include one or more conductive pads (not shown) in proximity to, adjacent to, or embedded in and exposed by the first surface 131 or the second surface 132 of the die 13.

The electronic device 100 may include a plurality of electrical contacts 191 disposed between the first surface 101 of the circuit structure 10 and the second surface 132 of the die 13. The electrical contacts 191 may attach the die 13 to the circuit structure 10. The circuit structure may be electrically connected to the die 13 through the electrical contacts 191. In some embodiments, the electrical contact 191 may include short pillars, solder balls, controlled collapse chip connection (C4) bumps, a ball grid array (BGA), or a land grid array (LGA)

The die 13 may include a plurality of conductive vias (or through-silicon vias) 135 extending through the die 13. The conductive vias 136 may extend from the second surface 132 to the active region 136 of the die 13. The conductive vias 135 may attach the die 13 to the circuit structure 10. The conductive vias 135 may be electrically connected to the conductive vias 107 through the electrical contacts 191. The power 11 may be transmitted from the circuit structure 10 to the active region 136 of the die 13 through the conductive vias 107, the electrical contacts 191, and the conductive vias 135. In some embodiments, the conductive vias 135 may be formed of metal or metal alloy. The conductive vias 135 may include metal, such as, copper, gold, silver, aluminum, titanium, tantalum, or the like.

The electronic device 100 may include a plurality of electrical contacts 192 disposed between the first surface 131 of the die 13 and the second surface 122 of the circuit structure 12. The electrical contacts 192 may attach the die 13 to the circuit structure 12. The circuit structure 12 may be electrically connected to the die 13 through the electrical contacts 192. In some embodiments, the electrical contacts 192 may include electroplated short pillars, solder balls, controlled collapse chip connection (C4) bumps, a ball grid array (BGA), or a land grid array (LGA).

In some embodiments, the die 13 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some embodiments, the die 13 may include one or more processing elements and one or more memory elements electrically connected to the processing elements. The processing element(s) and the memory element(s) may be divided from or originate in a monolithic processing unit (e.g., a CPU, a MPU, a GPU, a MCU, an ASIC, or the like). In some embodiments, the processing element may be a CPU chiplet, a MCU chiplet, a GPU chiplet, an ASIC chiplet, or the like. The memory element may be a cache memory. In some embodiments, a wafer node of the processing element is less or smaller than a wafer node of the memory element. In some embodiments, a wafer node of the processing element may lead a wafer node of the memory element by one or more generations. For example, the processing element may be a 5 nm or less node wafer, such as a 3 nm or less node wafer, a 2 nm or less node wafer, or less; and the memory element may be a 20 nm or more node wafer, such as a 28 nm or more node wafer, a 32 nm or more node wafer, or greater.

The die 14 (or input/output (I/O) unit) may be disposed below the circuit structure 12. The die 14 may be disposed over the second surface 122 of the circuit structure 12. The die 14 may be disposed above the circuit structure 10. The die 14 may be disposed between the circuit structures 10 and 12. The die 14 may be disposed adjacent to the die 13. The die 14 may be spaced apart from the die 13. The die 14 may be surrounded by the encapsulating layer 11. In some embodiments, the die 14 may be encapsulated by the encapsulating layer 11. The die 14 has a first surface 141 facing the circuit structure 12 and a second surface 142 opposite to the first surface 141 of the die 14. The first surface 141 may be an active surface, through which the die 14 receives data signals from other components of the electronic device 100 or an external component. The active surface 131 of the die 13 may face the die 15. The die 14 may include one or more active circuits adjacent to the first surface 141. The second surface 142 may be a backside surface. The die 14 may include one or more conductive pads (not shown) in proximity to, adjacent to, or embedded in and exposed by the first surface 141 of the die 14.

The electronic device 100 may include a plurality of electrical contacts 193 disposed between the first surface 141 of the die 14 and the second surface 122 of the circuit structure 12. The electrical contacts 193 may attach the die 14 to the circuit structure 12. The circuit structure 12 may be electrically connected to the die 14 through the electrical contacts 193. In some embodiments, the electrical contacts 193 may include electroplated short pillars, solder balls, controlled collapse chip connection (C4) bumps, a ball grid array (BGA), or a land grid array (LGA).

The die 14 has a lateral surface 143 facing away from the die 13 and a lateral surface 144 facing the die 13. The lateral surfaces 143 and 144 of die 14 extend from the first surface 141 to the second surface 142 of the die 14. The die 13 has a lateral surface 133 facing away from the die 14 and a lateral surface 134 facing the die 14. The lateral surfaces 133 and 134 of die 13 extend from the first surface 131 to the second surface 132 of the die 13.

The electronic device 100 may further include an adhesive layer 18. The adhesive layer 18 is disposed between the first surface 101 of the circuit layer 10 and the second surface 142 of the die 14. The adhesive layer 18 is configured to attach the die 14 to the circuit structure 10. The adhesive layer 18 may be electrically isolated and can be referred to as an electrically isolated adhesive layer. With the existence of the adhesive layer 18, no electrical signal can be transmitted between the die 14 and the circuit structure 10 from the second surface 142 of the die 14. The adhesive layer 18 may be thermally conductive. The heat can be dissipated from the die 14 to the circuit structure 10 through the adhesive layer 18.

In some embodiments, the die 14 may include one or more input/output (I/O) units. The I/O units of the die 14 are configured to process the data signals from the die 13, die 15, or other components of the electronic device 100. The I/O units of the die 14 are configured to interconnect the electronic device 100 and an external device (not shown). In some embodiments, the die 14 may be a Serializer/Deserializer (SerDes). The SerDes 14 may be configured to convert data between serial data and parallel interfaces in each direction. The SerDes 14 may provide data transmission over a single line in order to minimize the number of I/O pins and interconnects. In some embodiments, a wafer node of the die 14 may be greater than that of the die 13.

The die 15 may be disposed above the circuit structure 12. The die 15 may be disposed over the first surface 121 of the circuit structure 12. The die 15 may be disposed above the circuit structure 10. The die 15 has a first surface 151 facing the circuit structure 12 and a second surface 152 opposite to the first surface 151 of the die 15. The first surface 151 may be an active surface, through which the die 15 receives data signals from other components of the electronic device 100 or an external component. The second surface 152 may be a backside surface. The die 15 may include one or more conductive pads (not shown) in proximity to, adjacent to, or embedded in and exposed by the first surface 151 of the die 15.

The electronic device 100 may include a plurality of electrical contacts 194 disposed between the first surface 151 of the die 15 and the first surface 121 of the circuit structure 12. The electrical contacts 194 may attach the die 15 to the circuit structure 12. The circuit structure 12 may be electrically connected to the die 15 through the electrical contacts 194. In some embodiments, the electrical contact 194 may include solder balls, controlled collapse chip connection (C4) bumps, a ball grid array (BGA), or a land grid array (LGA).

In some embodiments, the die 15 may be a memory unit (or a data storage unit). The die 15 may include a memory. The die 15 may include dynamic random access memory (DRAM), static random access memory (SRAM), magnetoresistive random access memory (MRAM), flash memory, high bandwidth memory (HBM), or other suitable memory.

The connection element 16 is disposed over the circuit structure 10. The connection element 16 may be disposed between the circuit structure 10 and the circuit structure 12. The connection element 16 may be disposed beside the die 13. The connection element 16 may extend along the lateral surface 133 of the die 13. The connection element 16 may be surrounded by the encapsulating layer 11. The connection element 16 may extend between the circuit structures 10 and 12. The connection element 16 may electrically connect the circuit structure 10 and the circuit structure 12. The connection element 16 may include a conductive pillar or a conductive via. The connection element 16 may be formed of metal or metal alloy. The connection element 16 may include metal, such as, copper, gold, silver, aluminum, titanium, tantalum, or the like. As shown in FIG. 1, a plurality of connection elements similar to the connection element 16 may extend along the lateral surface 133 of the die 13 and electrically connect the circuit structure 10 and the circuit structure 12.

The connection element 17 is disposed over the circuit structure 10. The connection element 17 may be disposed between the circuit structure 10 and the circuit structure 12. The connection element 17 may be disposed beside the die 14. The connection element 17 may extend along the lateral surface 143 of the die 14. The connection element 17 may be surrounded by the encapsulating layer 11. The connection element 17 may extend between the circuit structures 10 and 12 through the encapsulating layer 11. The connection element 17 may electrically connect the circuit structure 10 and the circuit structure 12. The connection element 17 may include a conductive pillar or a conductive via. The connection element 17 may be formed of metal or metal alloy. The connection element 17 may include metal, such as copper, gold, silver, aluminum, titanium, tantalum, or the like. As shown in FIG. 1, a plurality of connection elements similar to the connection element 17 may extend along the lateral surface 143 of the die 14 and electrically connect the circuit structure 10 and the circuit structure 12.

As shown in FIG. 1, the circuit structure 10 has a first region 10A including a plurality of conductive vias (or a non-power vias) 105. The connection elements 16 are disposed over the first region 10A and electrically connect the conductive vias 105. The conductive vias 105 may be aligned with the connection elements 16. The conductive vias 105 of the circuit structure 10 may be configured to receive a first signal (e.g., data signal, control signal, or non-power signal) ES1 from the second surface 102 of the circuit structure 10. The first signal ES1 is transmitted through a data transmission path (or a non-power signal transmission path or a signal path) S11, which is established in the conductive vias 105 and the connection elements 16. The first signal ES1 is transmitted along the lateral surface 133 of the die 13. The first signal ES1 may be transmitted to the circuit structure 12 through the data transmission path S11.

The circuit structure 12 may include a dielectric layer 124, conductive layers 125, 126, 127, and 128. The conductive layers 125, 126, 127, or 128 may be surrounded by the dielectric layer 124. The conductive layer 125, 126, 127, or 128 extends parallel to the first surface 121 of the circuit structure 12. The conductive layer 125, 126, 127, or 128 may have a portion extending parallel to the first surface 121 of the circuit structure 12. The conductive layer 125, 126, 127, or 128 may extend parallel to the first surface 151 of the die 15, the first surface 141 of the die 14, or the first surface 131 of the die. The conductive layers 125, 126, 127, and 128 may be formed of metal or metal alloy. The conductive layers 125, 126, 127, and 128 may include metal, such as copper, gold, silver, aluminum, titanium, tantalum, or the like.

The conductive layer 125 overlaps the connection element 16 and the die 13 in a direction perpendicular to the first surface 121 of the circuit structure 12. The conductive layer 125 is configured to provide an interconnection between the connection element 16 and the die 13. The conductive layer 125 may receive the first signal ES1 from the connection elements 16. Subsequently, the first signal ES1 is transmitted from the connection element 16 (or a portion of the data transmission path S11) to the die 13 (e.g., the active circuits adjacent to the active surface 131 of the die 13) through a data transmission path S13, which is established in the circuit structure 12 (e.g., the conductive layer 125). The data transmission path S13 may be further included in the electrical contacts 192 and conductive pads (not shown) on or adjacent to the first surface 131 of the die 13. The first die 13 is configured to receive the first signal ES1 through the data transmission paths S11 and S13 (can be collectively referred to a non-power transmission path). The non-power signal transmission path S11 and S13 is provided along the lateral surface 133 of the die 13 and in the circuit structure 12. In other words, the circuit structure 12 extends over the lateral surface 133 of the die 13 to transmit the first signal ES1 to the die 13.

The die 13 is configured to generate a second signal (e.g., data signal, control signal, or non-power signal) ES2 in response to the first signal ES1. For example, the die 13 may be configured to generate the second signal ES2 with a data format different from that of the first signal ES1, but include substantially the same information. In yet another example, the die may be configured to generate the second signal ES2 based on the calculation or analysis of the first signal ES1. In some embodiments, the die 13 may be configured to transmit the first signal ES1, and thus the first signal ES1 and the second signal ES2 may be the same.

The conductive layer 126 overlaps the die 13 in a direction perpendicular to the first surface 121 of the circuit structure 12. The conductive layer 126 overlaps the die 15 in a direction perpendicular to the first surface 121 of the circuit structure 12. The conductive layer 126 may has a portion extending perpendicular to the first surface 121 of the circuit structure 12. The conductive layer 126 is configured to provide an interconnection between the die 13 and the die 15.

The die 15 may communicate with the die 13 through the circuit structure 12. The second signal ES2 is transmitted from the die 13 to the die 15 through a data transmission path S15, which is established in the circuit structure 12 (e.g., the conductive layer 126). The second signal ES2 is transmitted through a data transmission path S15, which is established in the circuit structure 12 (e.g., the conductive layer 126). The data transmission path S15 may be included in one or more of the electrical contacts 194 and conductive pads (not shown) on or adjacent to the first surface 121 of the circuit structure 12, the first surface 131 of the die 13, or the first surface 151 of the die 15.

The die 15 may include a conductive layer 158, and. The conductive layer 158 extends parallel to the first surface 121 of the circuit structure 12. The conductive layer 158 extends parallel to the first surface 151 of the die 15. The die 15 may electrically connect the die 13 to the die 14. The die 13 may communicate with the die 14 through the die 15. The die 15 may be configured to transmit the second signal ES2 from the die 13 to the die 14. The second signal ES2 may be transmitted through a data transmission path S16, which is established in the die 15 (e.g., the conductive layer 158). The second signal ES2 can be transmitted through the die 15. The die 15 may be configured to transmit a non-power signal (e.g., the second signal ES2) from the die (or the computing unit) 13 to the die (or the I/O unit) 14. In other words, the die 15 can be referred to as a bridge unit (or a bridge die) which provides an interconnection between a plurality of dies. The die 15 can have a function that cooperates with the dies 13 and 14. For example, the die 13 can read the data that is stored in the memory of the die 15 or write the memory in the die 15. The die 14 can read the data that is stored in the die 15. The die 13 may be configured to access the data in the die 15. The data stored in the die 15 is configured to be accessed by the die 13.

The conductive layer 127 overlaps the die 13 in a direction perpendicular to the first surface 121 of the circuit structure 12. The conductive layer 127 overlaps the die 15 in a direction perpendicular to the first surface 121 of the circuit structure 12. The conductive layer 127 may have a portion extending perpendicular to the first surface 121 of the circuit structure 12. The conductive layer 127 is configured to provide an interconnection between the die 13 and the die 15.

The die 15 may communicate with the die 14 through the circuit structure 12 (e.g., the conductive layer 127). The die 15 may transmit the second signal ES2 to the circuit structure 12 (e.g., the conductive layer 127). The second signal ES2 may be transmitted to the die 14 through a data transmission path S17, which is established in the circuit structure 12 (e.g., the conductive layer 127). The data transmission path S17 may be included in one or more of the electrical contacts 194, one or more of the electrical contacts, and conductive pads (not shown) on or adjacent to the first surface 121 of the circuit structure 12, the first surface 131 of the die 13, or the first surface 151 of the die 15.

The die 14 may receive the second signal ES2 by the first surface 141 thereof. The die 14 may be configured to transfer the second signal ES2 to an external device.

The conductive layer 128 overlaps the connection element 17 and the die 14 in a direction perpendicular to the first surface 121 of the circuit structure 12. The conductive layer 128 is configured to provide an interconnection between the connection element 17 and the die 14. The conductive layer 128 may receive the second signal ES2 from the die 14. Subsequently, the second signal ES2 is transmitted from the die 14 to the connection element 17 through a data transmission path S19, which is established in the circuit structure 12 (e.g., the conductive layer 128). The data transmission path S19 may be further included in the electrical contacts 193 and conductive pads (not shown) on or adjacent to the first surface 141 of the die 14. In other words, the circuit structure 12 extends over the lateral surface 143 of the die 14 to transmit the second signal ES2 from the die 14.

The circuit structure 10 may be configured to receive the second signal ES2 from the circuit structure 12 (e.g., the conductive layer 128). The circuit structure 10 may include a plurality of conductive vias 106 electrically connects the connection elements 17. The conductive vias 106 may be aligned with the connection elements 17. The second signal ES2 is transmitted through a data transmission path S21, which is established in the connection elements 17 and the conductive vias 106. The second signal ES2 is transmitted along the lateral surface 143 of the die 14. The second signal ES2 may be transmitted to the circuit structure 10 through the data transmission path S21. The circuit structure 10 may be configured to transmit the second signal ES2 from the second surface 102 of the circuit structure 10.

Accordingly, the first signal ES1 is transmitted to the die 13 (e.g., the active surface 131 of the die 13) through the data transmission paths S11 and S13. The second signal ES2, which is associated with the first signal ES1, is transmitted from the die 13 through the data transmission paths S15, S16, S17, S19, and S21. In some embodiments, the second signal ES2 is transmitted from the die 13 to the die 14 through the data transmission paths S15, S16, and S17. The data transmission paths S15, S16, and S17 may be collectively referred as a data transmission path consisting of the signal path from the die 13 to the die 15, the signal path S17 from the die 15 to the die 14 and the signal path S16 in the die 15. The signal path S16 connects the signal path S15 with the signal path S17. In some embodiments, the second signal ES2 is transmitted from the die 14 through the data transmission paths S19 and S21. In some embodiments, the circuit structure 12 is configured to provide the data transmission paths S11, S15, and/or S17.

In some embodiments, the first signal ES1 is transmitted from the circuit structure 10 to the die 13 through the connection element 16 and the circuit structure 12. In some embodiments, the die 13 is configured to generate the second signal ES2 which is transmitted to the circuit structure 10 through the die 15, the die 14, the circuit structure 12, and the connection element 17.

In some embodiments, the circuit structure 10 may be configured to transmit the first signal ES1 to the die 13 through the connection element 16 and the circuit structure 12, and to receive the second signal ES2 from the die 13 through the die 15, the die 14, the circuit structure 12, and the connection element 17.

In some embodiments, the direction of the data transmission can be reversed. That is, the circuit structure 10 may be configured to receive an input signal from the second surface 102 through the conductive vias 106. The input signal can be transmitted to the die 13 through the connection element 17, the circuit structure 12, die 14, and the die 15. The die 13 may be configured to process the input signal and generate an output signal, which will be transmitted to other components of the electronic device 100 or an external components through the circuit structure 12, the connection element 16, and the conductive vias 105 of the circuit structure 10.

Figure 6:
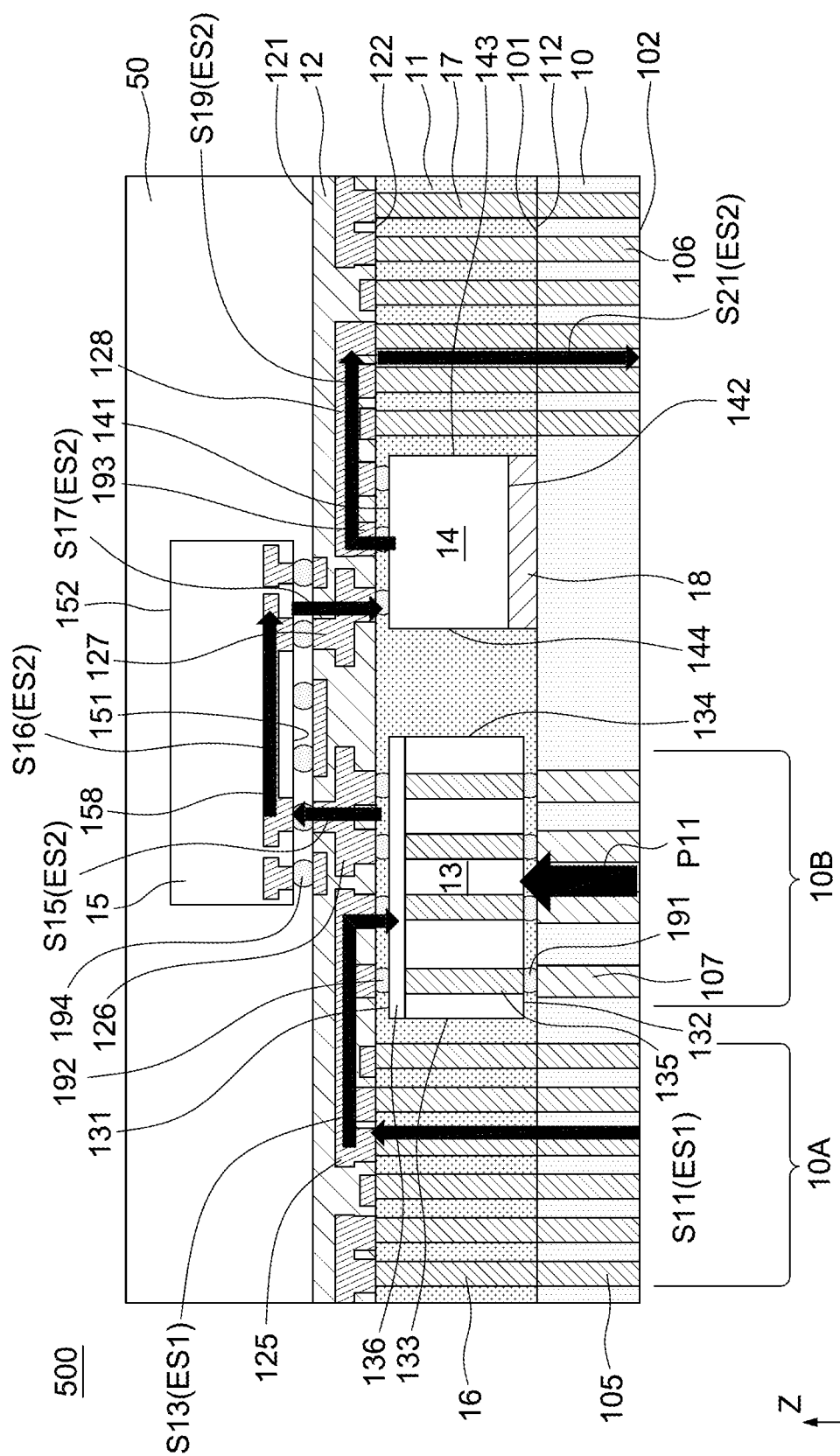
FIG. 6 is a cross-sectional view of an electronic device in accordance with some embodiments of the present disclosure.

The electronic device 100 may be configured to transmit one or more first signals and one or more second signals associated with the first signals between the dies of the electronic device 100 through the bridge interconnection provided by the circuit structure 12 and the die 15. The bridge die 15 is disposed at a different elevation than dies 13 and 14 and overlaps the dies 13 and 14 along a Z axis as shown in FIG. 6, such that the distance between the dies 13 and 14 along an X axis as shown in FIG. 6 can be small and the size of the electronic component 100 in a direction along the X-axis can be reduced. Similarly, the size of the electronic component 100 in a direction along a Y-axis (not shown) can be reduced. In an alternative embodiment, the die may not overlap the dies 13 and 14 along the Z axis. The conductive layers 126 and 127 may have a longer portion parallel to the first surface 121 of the circuit structure 12 to overlap the die and dies 13 and 14, respectively, for providing interconnection between the die 13 and die 15 and between the die 14 and die 15.

In the present disclosure, the die 15 is configured as a bridge for the communication between the die 13 and the die 14 and configured for a specific function, e.g., data storage. Owing to the integration of a bridge die and a function die, the size of the electronic device 100 in a direction along the X-axis can be reduced. The circuit structure 12 extends over the lateral surface 131 of the die 13 and the lateral surface 141 of the die 14 to transmit the first signal ES1 to the die 13 and transmit the second signal ES2 from the die 13. Furthermore, the circuit structure 12 transmits the first signal ES1 from the connection element 16 to the die 13. The circuit structure 12 transmits the second signal ES2 from the die 14 to the connection element 17. The circuit structure 12 provides a horizontal interconnection between the connection elements (e.g., the connections 16 and 17) and the dies (e.g., the dies 13 and 14) that are dislocated from the connection elements relative to the first surface 121 of the circuit structure 12.

The circuit structure 12 is disposed between the dies 13 and 14 and the die 15. Such an arrangement may be configured to provide interconnection among these dies. Owing to the arrangement of the circuit structure 12, the vertical data transmission path between the dies 13 and 14 and the die can be reduced, such that the noise and the transmission loss can be reduced.

The circuit structure 10 further has a second region 10B including a plurality of conductive vias (or power vias) 107. The die 13 may be disposed over the second region 10B of the circuit structure and electrically connects with the conductive vias 107. The second region may be disposed under the die 13. The second region 10B may be covered by the die 13. The conductive vias (or the power vias) 107 may be disposed under the die (or the computing unit) 13. On the other hands, the first region 10A may be uncovered by the die 13. The conductive vias (or the non-power vias) 105 may be uncovered by the die (or the computing unit) 13. The conductive vias 107 may be electrically connected to the conductive vias 135. The circuit structure 10 is configured to provide power P11 to the backside surface 132 of the die 13 through the conductive vias 107. The die 13 may be configured to receive the power P11 through the backside surface 132 thereof. A width W1 of one of the conductive vias 135 may be less than a width W2 of one of the conductive vias 107. The power can be provided to the backside surface 132 of the die 13, rather than the active surface 131 of the die. The power transmission path can be relatively short.

In some embodiments, the electronic device 100 may further include a plurality of electrical contacts or solder balls (not shown) disposed on the second surface 102 of the circuit structure 10 connected to the conductive vias 105, 106, and/or 107. The conductive vias 105, 106, and/or 107 may be connected to a printed circuit board, an external device, carrier, or system through the plurality of electrical contacts (or solder balls) on the second surface 102 of the circuit structure 10. The conductive vias 105, 106, and/or 107 may be formed of metal or metal alloy. The conductive vias 105, 106, and/or 107 may include metal, such as, copper, gold, silver, aluminum, titanium, tantalum, or the like.

Figure 2:
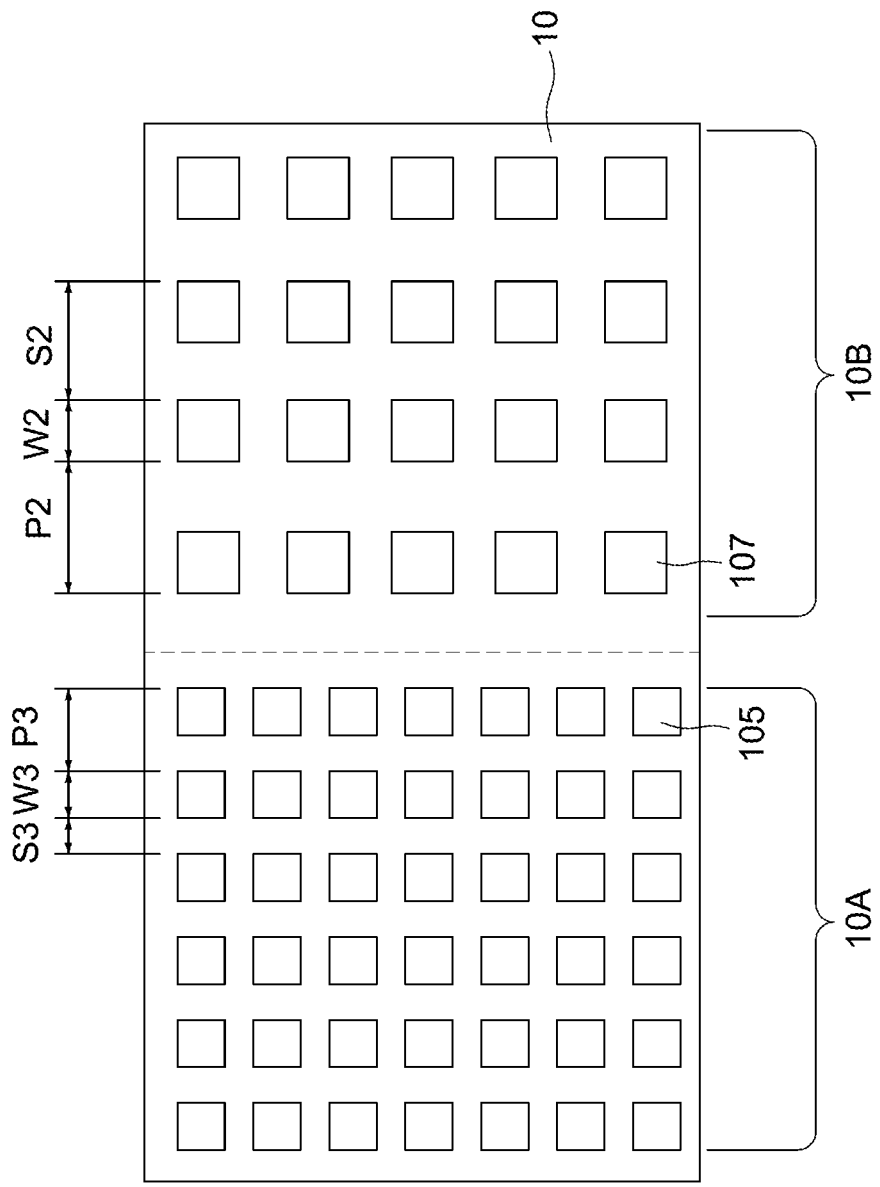
FIG. 2 is an underside view of an electronic device in accordance with some embodiments of the present disclosure.

FIG. 2 is an underside view of an electronic device (e.g., the electronic device 100) in accordance with some embodiments of the present disclosure. As shown in FIG. 2, the circuit structure 10 has the first region 10A including the plurality of conductive vias 105, and the second region 10B including the plurality of conductive vias 107. The distribution of the conductive vias 105 may define the first region 10A. The distribution of the conductive vias 107 may define the second region 10B.

The conductive vias 105 have a pitch P3. The conductive vias 107 have a pitch P2. The pitch P2 of the plurality of conductive vias 107 is greater than the pitch P3 of the plurality of conductive vias 105. The conductive vias 105 has a width W3. The conductive vias 105 has a space S3. The pitch P3 of the conductive vias 105 is equal to the width W3 plus the space S3. The conductive vias 107 has a width W2. The conductive vias 107 has a space S2. The pitch P2 of the conductive vias 107 is equal to the width W2 plus the space S2. The width W2 of the plurality of conductive vias 107 is greater than the width W3 of the conductive vias 105. The pitch P2 of the plurality of conductive vias 107 is greater than the pitch P3 of the conductive vias 105.

The circuit structure 10 includes a plurality of sets of conductive vias (e.g., the conductive vias 105 and 107) with multiple different pitches. The plurality of conductive vias 105 with a finer size are configured to transmit non-power signals (e.g., data signals or control signals). The first region 10A may be referred to as a data transmission region. The first region may be configured to transmit a non-power signal (e.g., the first signal ES1) to the die 13. The plurality of conductive vias 107 with a greater size are configured to transmit power signals. The second region 10B may be referred to as a power transmission region. The second region may be configured to transmit a power (e.g., the power P11) to the die 13 through the backside surface 132 thereof. The first region 10B is distinct from the first region 10A. The numbers of the conductive vias 105 may be greater than that of the conductive vias 107. Alternatively, the numbers of the conductive vias 105 may be less than that of the conductive vias 107; the numbers of the conductive vias 105 may be the same as that of the conductive vias 107.

Figure 3:
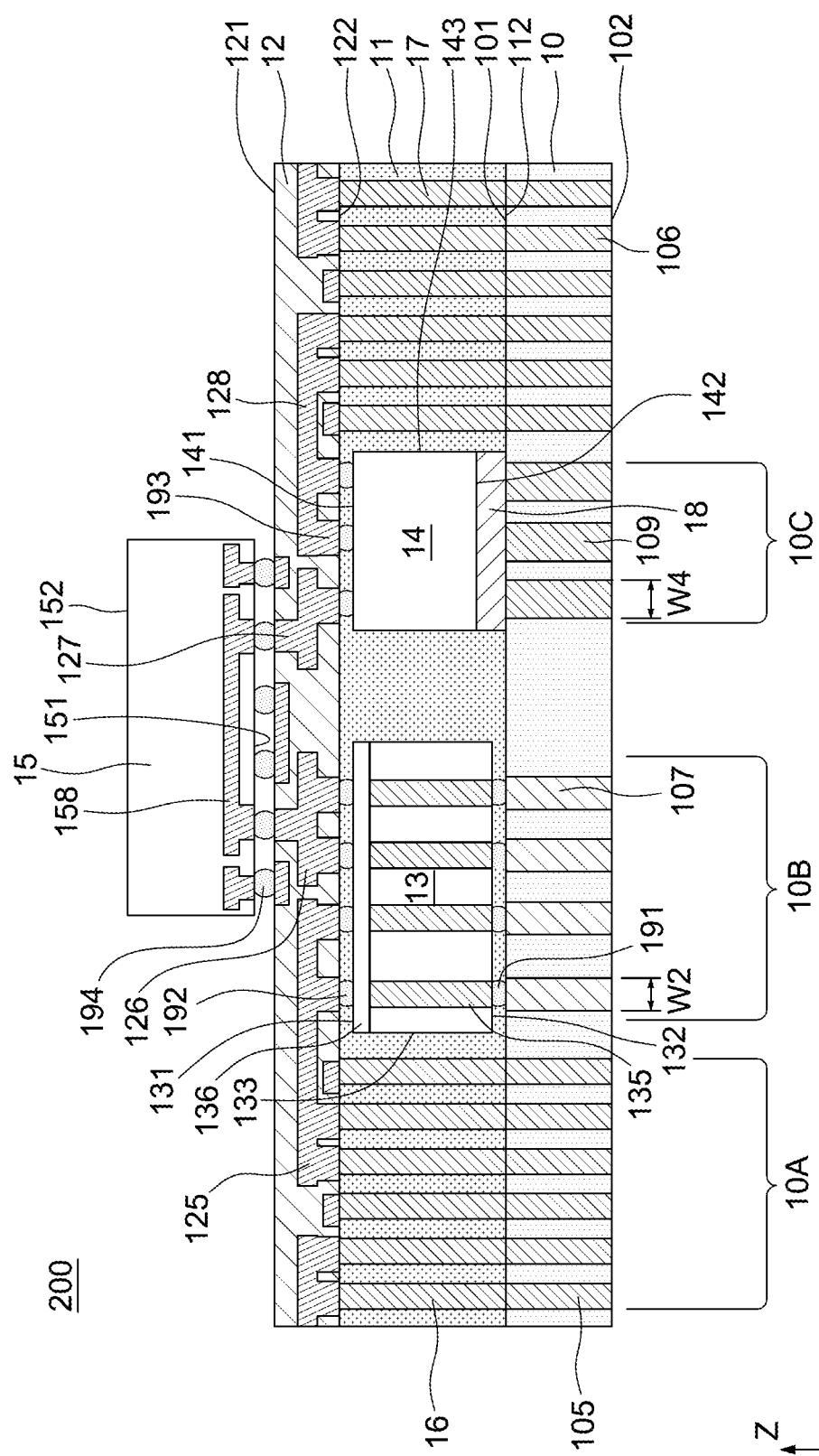
FIG. 3 is a cross-sectional view of an electronic device in accordance with some embodiments of the present disclosure.

FIG. 3 is a cross-sectional view of an electronic device 200 in accordance with some embodiments of the present disclosure. The electronic device 200 in FIG. 3 is similar to the electronic device 100 in FIG. 1. Therefore, some detailed descriptions may refer to corresponding preceding paragraphs and are not repeated hereinafter for conciseness, with differences therebetween as follows.

As shown in FIG. 3, the circuit structure 10 of the electronic device 200 further has a third region 10C configured to transfer or dissipate heat from the die 14. The carrier 10 may be configured to provide a power (e.g., the power P11) to the computing unit 13 and dissipate heat from the I/O unit 14. The third region 10C may be disposed under the die 14. The third region includes a thermal via 109. The thermal via 109 may be disposed under the die 14. The thermal via 109 is thermally conductive. The thermal via 109 is more thermally conductive than the dielectric material of the circuit structure 10. The third region 10C includes more thermal vias similar to the thermal via 109. A width W4 of the thermal vias 109 may be greater than the width W2 of the power via 107. The thermal vias 109 of the circuit structure 10 can reduce the risk of crack and/or alleviate dishing effect during the polishing process of the circuit structure 10. The variation of the thickness of the circuit structure 10 from the first surface 101 to the second surface 102 can be reduced.

The adhesive layer 18 may be electrically isolated but thermally conductive. The adhesive layer 18 may include heat dissipation gel or thermal interface material, which may include as silicone, wax, polymer, metal, or other suitable material. The heat of the die 14 may be dissipated to an external environment through the adhesive layer 18 and the thermal via 109.

In some embodiments, the electronic device 100 may further include a plurality of electrical contacts or solder balls (not shown) disposed on the second surface 102 of the circuit structure 10 connected to the thermal vias 109. The thermal vias 109 may be connected to a printed circuit board, an external device, carrier, or system through the plurality of electrical contacts (or solder balls) on the second surface 102 of the circuit structure 10. The conductive vias 109 may be formed of metal or metal alloy. The conductive vias 109 may include metal, such as, copper, gold, silver, aluminum, titanium, tantalum, or the like.

Figure 4:
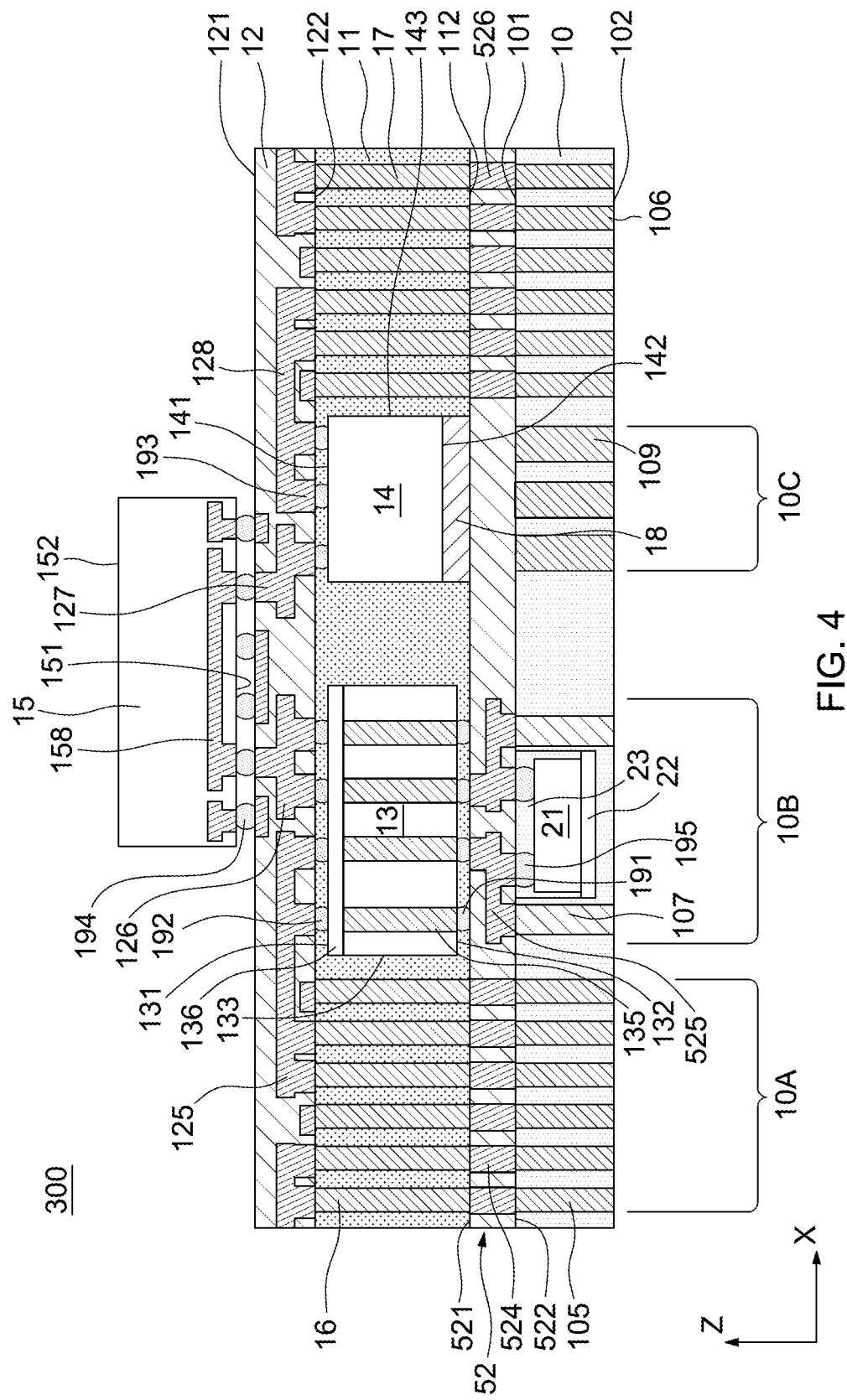
FIG. 4 is a cross-sectional view of an electronic device in accordance with some embodiments of the present disclosure.

FIG. 4 is a cross-sectional view of an electronic device 300 in accordance with some embodiments of the present disclosure. The electronic device 300 in FIG. 4 is similar to the electronic device 200 in FIG. 3. Therefore, some detailed descriptions may refer to corresponding preceding paragraphs and are not repeated hereinafter for conciseness, with differences therebetween as follows.

The electronic device 300 further includes a circuit structure 52 disposed over the circuit structure 10. The circuit structure 52 may be disposed below the dies 13 and 14 and the connection elements 16 and 17. The circuit structure 52 may be configured to electrically connect the dies 13 and 14, and the connection elements 16 and 17 to the circuit structure 10. The circuit structure 52 has a first surface 521 and a second surface 522 opposite to the first surface 521 thereof. The first surface 521 of the circuit structure 52 may face away from the circuit structure 10 and the second surface 522 of the circuit structure 52 may face the circuit structure 10. In some embodiments, the circuit structure 52 may include, for example, a printed circuit board (PCB), such as a paper-based copper foil laminate, a composite copper foil laminate, or a polymer-impregnated glass-fiber-based copper foil laminate. In some embodiments, the circuit structure 52 may include a semiconductor substrate including silicon, germanium, or other suitable materials.

The circuit structure 52 includes conductive layers 524, 525, and 526. The conductive layers 524, 525, and 526 may be formed of metal or metal alloy. The conductive layers 524, 525, and 526 may include metal, such as, copper, gold, silver, aluminum, titanium, tantalum, or the like.

The conductive layer 524 may extend from the first surface 521 to the second surface 522 of the circuit structure 52. The conductive layer 524 may provide interconnection between the conductive vias 105 of the circuit structure 10 and the connection elements 16. The conductive layer 526 may extend from the first surface 521 to the second surface 522 of the circuit structure 52. The conductive layer 526 may provide interconnection between the conductive vias 106 of the circuit structure 10 and the connection elements 17.

The electronic device 300 further includes a passive component (or a capacitor structure) 21 disposed within the circuit structure 10. In some embodiments, the passive component 21 is accommodated in a cavity defined by the circuit structure 10. The capacitor 21 structure is attached to a bottom surface of the cavity through an adhesive layer 22. The capacitor 21 structure is surrounded by an encapsulant 23, which may fill the cavity. In some embodiments, the encapsulant 23 may include an epoxy resin including fillers, a molding compound (e.g., an epoxy molding compound or other molding compound), polyimide, a phenolic compound or material, a material including silicone dispersed therein, or a combination thereof. The passive component 21 is attached to the circuit structure 52 through a plurality of electrical contacts 195. In some embodiments, the electrical contact 195 may include solder balls, controlled collapse chip connection (C4) bumps, a ball grid array (BGA), or a land grid array (LGA).

The passive component 21 is disposed below or under the die 13. The passive component 21 is electrically connected to the die 13 through the circuit structure 52 (e.g., the conductive layer 525). The passive component 21 may be electrically connected to the conductive vias 107 through the circuit structure 52 (e.g., the conductive layer 525). The passive component 21 may be configured to receive power from an external power source through the conductive vias 107 of the circuit structure 10. The passive component 21 is configured to adjust power transmitted to the die 13. The passive component 21 is configured to stabilize the power transmitted to the die 13. The passive component 21 is configured to filter noise from the power transmitted to the die 13. The passive component 21 may include a decoupling capacitor. The passive component 21 may include a capacitor, a surface mount technology (SMT) capacitor device, a ceramic capacitor, a deep trench capacitor (DTC), or the like.

Figure 5:
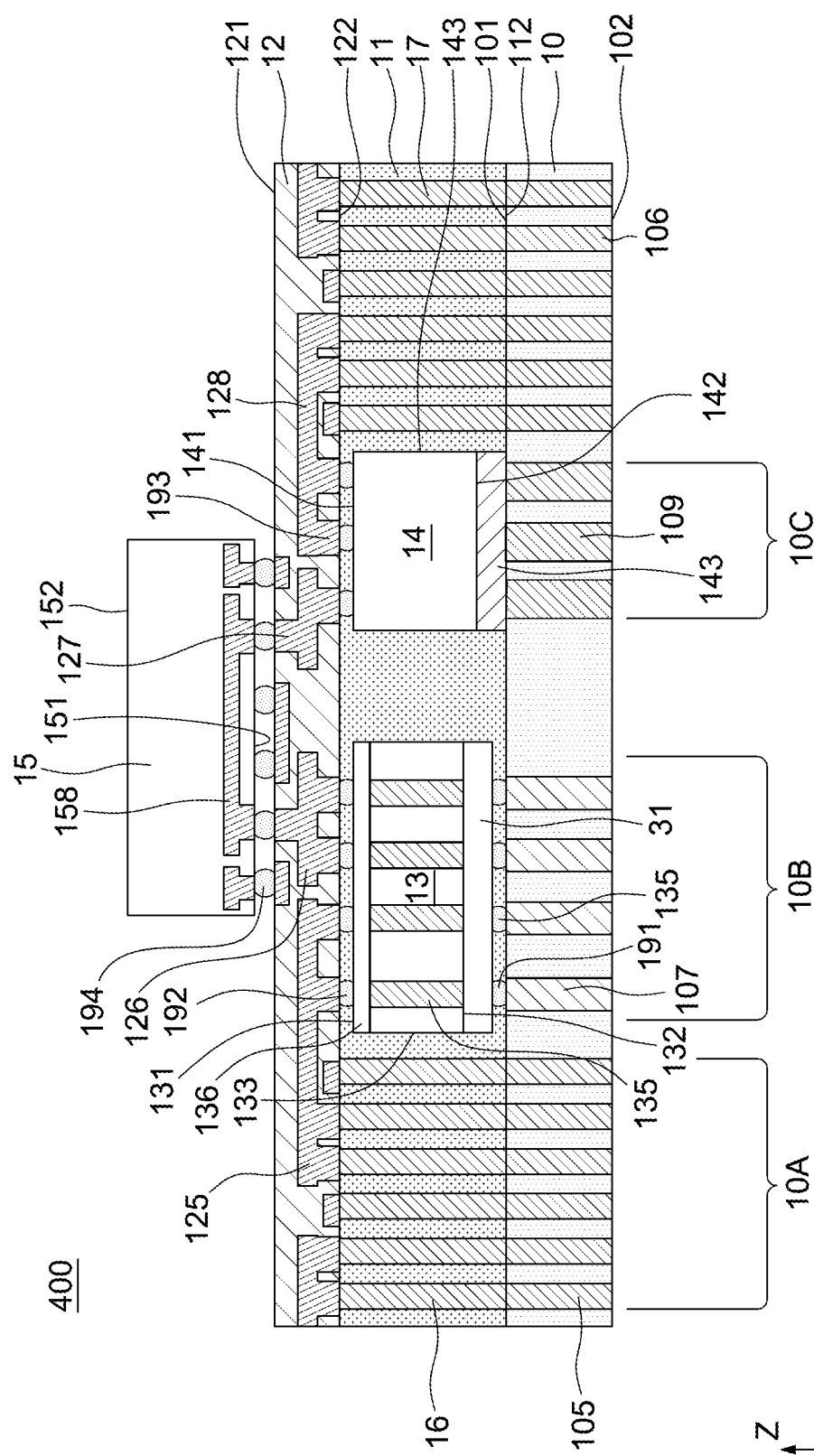
FIG. 5 is a cross-sectional view of an electronic device in accordance with some embodiments of the present disclosure.

FIG. 5 is a cross-sectional view of an electronic device in accordance with some embodiments of the present disclosure. The electronic device 400 in FIG. 5 is similar to the electronic device 200 in FIG. 3. Therefore, some detailed descriptions may refer to corresponding preceding paragraphs and are not repeated hereinafter for conciseness, with differences therebetween as follows.

The electronic device 400 further includes a circuit (capacitor structure) 31 disposed under the second surface 132 of the die 13. The circuit 31 may be surrounded by the encapsulating layer 11. In some embodiments, the circuit 31 may be encapsulated by the encapsulating layer 11. The circuit 31 may include a thin film capacitor. The circuit 31 is electrically connected to the die 13 and the conductive vias 107. The circuit 31 may be configured to receive power from an external power source through the conductive vias 107 of the circuit structure 10. The circuit 31 is configured to adjust power transmitted to the die 13. The circuit 31 is configured to stabilize the power transmitted to the die 13 and filter noise from the power transmitted to the die 13. The circuit 31 may include a decoupling capacitor.

FIG. 6 is a cross-sectional view of an electronic device 500 in accordance with some embodiments of the present disclosure. The electronic device 500 in FIG. 6 is similar to the electronic device 100 in FIG. 1. Therefore, some detailed descriptions may refer to corresponding preceding paragraphs and are not repeated hereinafter for conciseness, with differences therebetween as follows.

As shown in FIG. 6, the electronic device 500 further including an encapsulating layer 50 disposed on the first surface 121 of the circuit layer 12. The encapsulating layer 50 may cover the first surface 121 of the circuit layer 12. The die 15 may be surrounded by the encapsulating layer 50. The die 15 may be encapsulated by the encapsulating layer 50. The electrical contacts 194 may be surrounded by the encapsulating layer 50. The electrical contacts 194 may be encapsulated by the encapsulating layer 50.

In some embodiments, the encapsulating layer 50 may include an epoxy resin including fillers, a molding compound (e.g., an epoxy molding compound or other molding compound), polyimide, a phenolic compound or material, a material including silicone dispersed therein, or a combination thereof.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first circuit structure;
a first die disposed below the first circuit structure;
a second die disposed below the first circuit structure; and
a third die disposed above the first circuit structure and electrically connecting the first die to the second die,
wherein the first die communicates with the second die through the third die,
wherein the first die includes an active surface facing the first circuit structure and a backside surface opposite to the active surface of the first die, wherein the first die is configured to receive a power through the backside surface thereof.

2. The electronic device of claim 1, wherein the third die is a data storage unit, wherein the first die is configured to access data in the third die.

3. The electronic device of claim 2, wherein the second die is a Serializer/Deserializer (SerDes).

4. The electronic device of claim 1, wherein a non-power signal transmission path is provided along a lateral surface of the first die and in the first circuit structure, and wherein a non-power signal is transmitted to an active circuit adjacent to the active surface of the first die through the non-power signal transmission path.

5. The electronic device of claim 1, further comprising:
a second circuit structure having a first region and a second region distinct from the first region,
wherein the first region of the second circuit structure is configured to transmit a non-power signal to the first die through the first circuit structure, and
wherein the second region of the second circuit structure is configured to transmit the power to the first die through the backside surface of the first die.

6. The electronic device of claim 5, wherein the first region is uncovered by the first die, and wherein the second region is disposed under the first die.

7. The electronic device of claim 6, wherein the first die includes a first conductive via extending through the first die, and wherein the second region comprises a second conductive via electrically connected to the first conductive via.

8. The electronic device of claim 7, wherein a width of the first conductive via is less than that of the second conductive via.

9. The electronic device of claim 5, wherein the second circuit structure further has a third region configured to dissipate heat from the second die.

10. The electronic device of claim 1, wherein a data transmission path consists of a first signal path from the first die to the third die, a second signal path from the third die to the second die, and a third signal path in the third die, wherein the third signal path connects the first signal path with the second signal path.

11. The electronic device of claim 1, wherein the second die is disposed adjacent to the first die,
wherein the third die is configured to transmit a non-power signal from the first die to the second die,
wherein data stored in the third die is configured to be accessed by the first die.

12. The electronic device of claim 11, wherein the first circuit structure is configured to provide a first data transmission path for transmitting a first non-power signal to the first die;
wherein the first circuit structure is configured to provide a second data transmission path for transmitting a second non-power signal between the first die and the third die; and
wherein the first circuit structure is configured to provide a third data transmission path for transmitting a third non-power signal between the third die and the second die.

13. The electronic device of claim 11, further comprising:
a second circuit structure comprising a power via and a non-power via,
wherein the power via is disposed under the first die, and the non-power via is uncovered by the first die.

14. The electronic device of claim 13, wherein a width of the power via is greater than that of the non-power via.

15. The electronic device of claim 13, wherein a pitch of the power via is greater than that of the non-power via.

16. The electronic device of claim 13, wherein the second circuit structure further comprises a thermal via disposed under the second die, wherein a width of the thermal via is greater than that of the power via.

17. The electronic device of claim 1,
wherein the second die has an active surface facing the third die and communicates with the first die through the third die; and
wherein the electronic device comprises a carrier configured to provide the power to the first die and dissipate heat from the second die.

18. The electronic device of claim 17, further comprising:
a passive component disposed under the first die and configured to stabilize the power and filter noise from the power.

19. The electronic device of claim 17, further comprising:
an encapsulating layer encapsulating the first die and the second die,
wherein the first die comprises a circuit disposed under the backside surface of the first die, and the circuit is configured to stabilize the power and filter noise from the power, and
wherein the circuit is encapsulated by the encapsulating layer.

* * * * *